(12) United States Patent
Xia et al.

(10) Patent No.: US 10,964,722 B2
(45) Date of Patent: Mar. 30, 2021

(54) MICRO LED DISPLAY SUBSTRATE, METHOD FOR MANUFACTURING THE SAME, AND DISPLAY DEVICE

(71) Applicant: Shanghai Tianma Micro-Electronics Co., Ltd., Shanghai (CN)

(72) Inventors: Xingda Xia, Shanghai (CN); Jujian Fu, Shanghai (CN); Gang Liu, Shanghai (CN)

(73) Assignee: Shanghai Tianma Micro-Electronics Co., Ltd., Shanghai (CN)

( * ) Notice: Subject to any disclaimer, the term of this patent is extended or adjusted under 35 U.S.C. 154(b) by 0 days.

(21) Appl. No.: 16/502,042

(22) Filed: Jul. 3, 2019

(65) Prior Publication Data

US 2019/0326330 A1  Oct. 24, 2019

(30) Foreign Application Priority Data

Oct. 15, 2018 (CN) .......................... 201811196327.5

(51) Int. Cl.
  *H01L 27/12* (2006.01)
  *H01L 33/62* (2010.01)
  (Continued)

(52) U.S. Cl.
  CPC ...... *H01L 27/1214* (2013.01); *H01L 25/0753* (2013.01); *H01L 27/156* (2013.01);
  (Continued)

(58) Field of Classification Search
  CPC .............. H01L 27/156; H01L 27/1214; H01L 25/0753; H01L 33/62; H01L 33/0093
  See application file for complete search history.

(56) References Cited

U.S. PATENT DOCUMENTS

| 6,559,506 B1 * | 5/2003 | Lee ................... H01L 27/14643 257/296 |
| 2007/0148809 A1 * | 6/2007 | Cho .................. H01L 27/14685 438/70 |

(Continued)

FOREIGN PATENT DOCUMENTS

| CN | 104915052 A | 9/2015 |
| CN | 106784410 A | 5/2017 |

(Continued)

OTHER PUBLICATIONS

Office Action of Chinese Patent Application No. 201811196327.5 dated Mar. 10, 2020.

*Primary Examiner* — Herve-Louis Y Assouman
(74) *Attorney, Agent, or Firm* — Kilpatrick Townsend & Stockton, LLP

(57) ABSTRACT

A Micro LED display substrate, a method for manufacturing the Micro LED display substrate, and a Micro LED display device are provided. In the method, the Micro LED is transferred onto the organic layer of the array substrate, one etching is performed to form through hole on both the protective layer and the array substrate, and then one metal deposition is performed to simultaneously form an electrode of the Micro LED and a structure electrically connecting the graphene layer with the source or drain electrode of the thin film transistor. Compared with the related art in which the electrode of the Micro LED and the structure electrically connecting the graphene layer with the source or drain electrode of the thin film transistor are formed through two etchings and two metal depositions, the method provided by the present disclosure saves the process steps, simplifies the process and reduces the costs.

8 Claims, 7 Drawing Sheets

(51) Int. Cl.
*H01L 25/075* (2006.01)
*H01L 27/15* (2006.01)
*H01L 25/16* (2006.01)
*H01L 33/00* (2010.01)

(52) U.S. Cl.
CPC .......... *H01L 33/0093* (2020.05); *H01L 33/62* (2013.01); *H01L 2933/0066* (2013.01)

(56) References Cited

U.S. PATENT DOCUMENTS

| | | | | |
|---|---|---|---|---|
| 2010/0006870 | A1* | 1/2010 | Lee | H01L 33/32 257/88 |
| 2015/0311415 | A1* | 10/2015 | Song | H01L 33/62 257/91 |
| 2017/0288102 | A1* | 10/2017 | Farrens | H01L 33/0093 |
| 2017/0358624 | A1* | 12/2017 | Takeya | H01L 25/167 |

FOREIGN PATENT DOCUMENTS

| | | | |
|---|---|---|---|
| CN | 106816512 A | * | 6/2017 |
| CN | 108461508 | * | 8/2018 |
| CN | 108461508 A | | 8/2018 |

* cited by examiner

MICRO LED DISPLAY SUBSTRATE, METHOD FOR MANUFACTURING THE SAME, AND DISPLAY DEVICE

CROSS-REFERENCE TO RELATED APPLICATIONS

The present application claims priority to Chinese Patent Application No. 201811196327.5, filed on Oct. 15, 2018, the content of which is incorporated herein by reference in its entirety.

FIELD

The present disclosure relates to the field of display technologies, and in particular, to a Micro Light-emitting Diode (Micro LED) display substrate, a method for manufacturing the Micro LED display substrate, and a Micro LED display device.

BACKGROUND

Compared with the Organic Light-Emitting Diode (OLED), LEDs have higher brightness, better luminous efficiency, and lower power consumption. With the development of LED technology, LEDs are not limited to usage as backlight.

With the development of technology, Micro LED has become a new generation of display technology. A method for manufacturing the Micro LED mainly includes: providing an array substrate, manufacturing a Micro LED structure on the array substrate, and forming sub-pixels arranged in an array. Each Micro LED is controlled by a driving circuit on the array substrate to emit light, thus realizing a display image.

However, the process for manufacturing the Micro LED display substrate in the related art is cumbersome and costly.

SUMMARY

In view of this, the present disclosure provides a micro light-emitting diode display substrate, a method for manufacturing the micro light-emitting diode display substrate, and a display device, in order to solve the problems of cumbersome and costly manufacturing process of the micro light-emitting diode display substrate in the related art.

In an aspect, the present disclosure provides a method for manufacturing a micro light-emitting diode display substrate, including: forming a graphene layer on a transfer substrate; forming a semiconductor layer on a surface of the graphene layer facing away from the transfer substrate, and forming a conductive layer on a surface of the semiconductor layer facing away from the transfer substrate, the semiconductor layer and the conductive layer forming a micro light-emitting diode; forming a protective layer on a surface of the micro light-emitting diode; providing an array substrate including a plurality of thin film transistor structures; forming an organic layer on the array substrate; transferring the micro light-emitting diode from the transfer substrate onto the organic layer so that the graphene layer is bonded to the organic layer; etching the protective layer on the surface of the micro light-emitting diode to form a first through hole exposing the conductive layer, and etching the array substrate to form a second through hole exposing a drain electrode or a source electrode of the plurality of thin film transistor structures through one etching process; and depositing a conductive metal layer, filling the first through hole and the second through hole and electrically connecting the drain electrode or the source electrode with the graphene layer.

In another aspect, the present disclosure provides a micro light-emitting diode display substrate, and the micro light-emitting diode display substrate is formed by the method for manufacturing the micro light-emitting diode display substrate as mentioned above. The micro light-emitting diode display substrate includes: an array substrate including a plurality of thin film transistor structures arranged in an array; an organic layer located on a surface of the array substrate; a graphene layer provided on a surface of the organic layer facing away from the array substrate; a micro light-emitting diode located on a surface of the graphene layer facing away from the array substrate; a protective layer located on a surface of the micro light-emitting diode; and a conductive metal layer, the conductive metal layer including a first conductive metal layer portion penetrating through the protective layer and electrically connected to the conductive layer of the micro light-emitting diode, and a second conductive metal layer portion electrically connecting the graphene layer and a drain electrode or a source electrode of the plurality of thin film transistor structures.

In still another aspect, the present disclosure provides a micro light-emitting diode display device, and the micro light-emitting diode display device includes the above-mentioned micro light-emitting diode display substrate.

BRIEF DESCRIPTION OF DRAWINGS

In order to more clearly explain the embodiments of the present disclosure, the drawings to be used in the description of the embodiments will be briefly described below.

DESCRIPTION OF EMBODIMENTS

Figure 1:
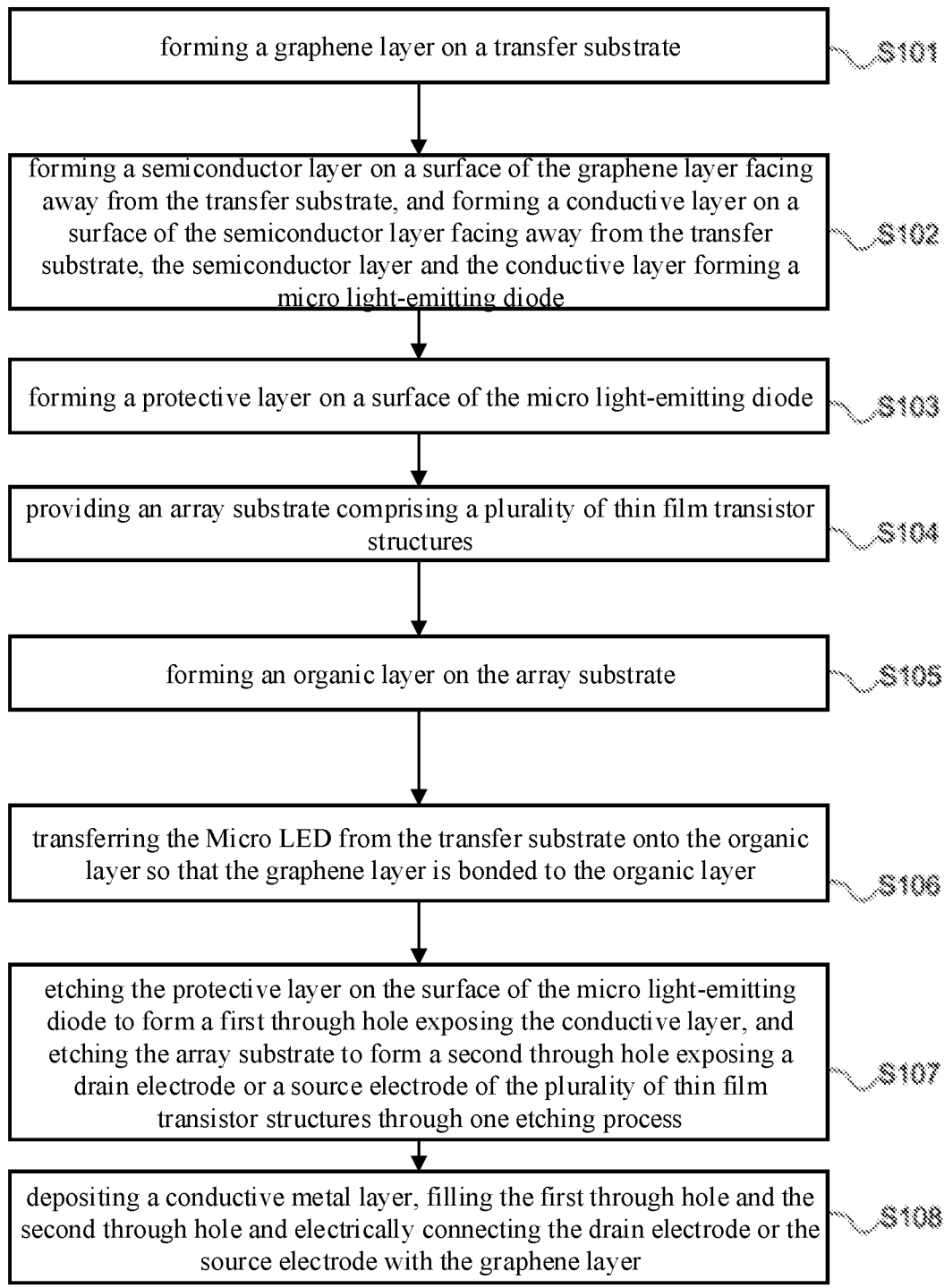
FIG. 1 is a schematic flow chart showing a method for manufacturing a Micro LED display substrate according to an embodiment of the present disclosure.

As described in the background section, the method for manufacturing the Micro LED display substrate in the related art has the problems of cumbersome and costly manufacturing process.

The inventors have found that, the above problems are caused due to the following method for manufacturing the Micro LED display substrate in the related art. The method includes: forming a graphene layer on a transfer substrate; forming a semiconductor layer and a conductive layer on the graphene layer to form a light-emitting diode structure; forming a protective layer on a surface of the conductive layer; removing the protective layer located on a partial surface of the conductive layer by a first etching; providing an underlay substrate; adsorbing the protective layer to transfer the light-emitting diode structure onto the underlay substrate; forming a transparent conductive layer on the protective layer by deposition; etching the transparent conductive layer to form a common electrode of the light-emitting diode; etching the underlay substrate to form a through hole so as to expose a drain electrode of the thin film transistor located on the underlay substrate; and forming a conductive metal layer in the through hole by deposition, filling the through hole, and electrically connecting the drain electrode with the graphene layer.

It can be seen that in the above method for manufacturing the Micro LED display substrate, when to form the electrode, it is necessary to perform once etching the protective layer, once depositing the transparent conductive layer, and patterning the transparent conductive layer to obtain a common electrode of the Micro LED. When to electrically connect the graphene layer with the drain electrode of the thin film transistor, it is also necessary to perform once etching to form a through hole in the underlay substrate so as to expose the drain electrode, and then depositing a metal layer to form an electrical connection structure. Due to the requirement of two etching steps and two conductive material deposition steps, the process for manufacturing the Micro LED display substrate is cumbersome, and an etching solution is required for each etching. After each deposition of the conductive material, a whole layer structure is formed. It is also necessary to pattern the entire layer structure to remove excess conductive material, resulting in waste of the conductive material and high manufacturing cost of the Micro LED display substrate.

Based on this, the present disclosure provides a method for manufacturing a Micro LED display substrate, including: forming a graphene layer on a transfer substrate; forming a semiconductor layer on a surface of the grapheme layer facing away from the transfer substrate, and forming a conductive layer on a surface of the semiconductive layer facing away from the transfer substrate, the semiconductive layer and the conductive layer forming a Micro LED; forming a protective layer on a surface of the Micro LED; providing an array substrate including thin film transistor structures; forming an organic layer on the array substrate; transferring the Micro LED from the transfer substrate to the organic layer so that the graphene layer is connected to the organic layer; etching the protective layer on the surface of the Micro LED to form a first through hole exposing the conductive layer, and etching the array substrate to form a second through hole exposing a drain electrode or a source electrode of the thin film transistor through one etching process; and depositing a conductive metal layer, filling the first through hole and the second through hole, and electrically connecting the drain electrode or the source electrode with the graphene layer.

In the method for manufacturing the Micro LED display substrate provided by the embodiments of the present disclosure, firstly the graphene layer is formed on the transfer substrate, then the Micro LED structure is formed on the graphene layer, then the protective layer is formed on the surface of the Micro LED, the Micro LED is transferred onto the organic layer of the array substrate by adsorption of the protection layer, and the transfer of the Micro LED is finished through bonding between the graphene layer and the organic layer. Then, through one etching step, through holes are formed in a same process step in the protective layer and the array substrate to expose the conductive layer of the Micro LED and the source electrode or the drain electrode of the thin film transistor on the array substrate, and then through one metal deposition step, the electrode of the Micro LED and the structure electrically connecting the graphene layer with the source electrode or drain electrode of the thin film transistor are formed. Compared with the related art in which two etching steps and two metal deposition steps are required to separately form the Micro LED electrode and the structure electrically connecting the graphene layer with the source electrode or the drain electrode of the thin film transistor, the method for manufacturing the Micro LED provided by the present disclosure saves process steps, simplifies the method for manufacturing the Micro LED and avoids waste generated from two etchings and two metal depositions, thereby reducing process costs.

In addition, the protective layer is etched to form the through hole after the transfer of the Micro LED is finished by adsorption of the protective layer. Therefore, on the one hand, during the transfer, the adsorption force is strong due to a large area of the protective layer, and the adsorption is firm and solid; and on the other hand, since the protective layer protects the Micro LED during the adsorption, contamination or damage from foreign matters to the Micro LED is avoided, ensuring the quality of the Micro LED before and after the transfer.

Embodiments of the present disclosure are clearly described in the following with reference to the accompanying drawings. It should be clear that the described embodiments are merely part of the embodiments of the present disclosure rather than all of the embodiments.

Referring to FIG. 1, FIG. 1 is a schematic flow chart showing a method for manufacturing a Micro LED display substrate according to an embodiment of the present disclosure. The method for manufacturing the Micro LED display substrate includes the following steps.

S101: a graphene layer is formed on a transfer substrate.

In this embodiment, the material of the transfer substrate is not limited. In an embodiment of the present disclosure, the transfer substrate may be made of sapphire, but is not limited thereto. In one embodiment, no chemical bond is formed between the transfer substrate and the grapheme layer, the graphene layer is bonded to the transfer substrate by a very weak van der Waals force, and the lattice form of the material of the transfer substrate is similar to the lattice structures of graphene and gallium nitride.

In this embodiment, a specific process for forming the graphene layer on the transfer substrate is not limited. In an embodiment of the present disclosure, a thin graphene film is grown by chemical vapor deposition on a substrate such as a copper sheet, and then the thin graphene film is peeled off from the substrate by thermal release tape—etching, UV curing—etching, electrolytic bubble stripping or dry etching, and transferred onto the transfer substrate.

S102: a semiconductor layer is formed on a surface of the grapheme layer facing away from the transfer substrate, and a conductive layer is formed on a surface of the semiconductor layer facing away from the transfer substrate, and the semiconductor layer and the conductive layer form a Micro LED.

Figure 2:
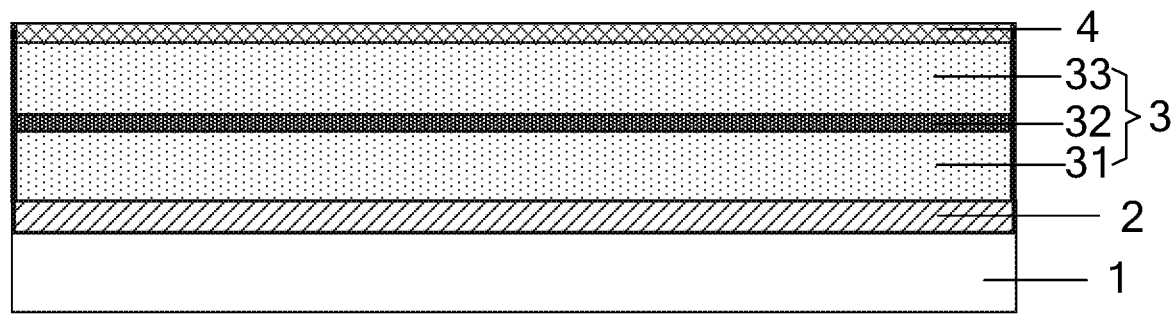
FIGS. 2-10 are schematic cross-sectional structural diagrams corresponding to a process for manufacturing a Micro LED display substrate according to an embodiment of the present disclosure.

Referring to FIG. 2, the step of forming a semiconductor layer 3 and a conductive layer 4 on a surface of the graphene layer 2 facing away from a transfer substrate 1 to form a Micro LED includes: forming a first type semiconductor layer 31 on the surface of the graphene layer 2 facing away from the transfer substrate 1; forming an active layer 32 on a surface of the first type semiconductor layer 31 facing away from the graphene layer 2; forming a second type semiconductor layer 33 on a surface of the active layer 32 facing away from the first type semiconductor layer 31; and forming a conductive layer 4 on a surface of the second type semiconductor layer 33 facing away from the active layer 32.

That is, a light-emitting diode epitaxial structure is grown on a composite substrate of sapphire and graphene. It should be noted that, in this embodiment, the semiconductor layer 3 at least includes the first type semiconductor layer 31, the active layer 32, and the second type semiconductor layer 33. The materials of the first type semiconductor layer 31 and the second type semiconductor layer 33 are not limited in this embodiment. In an embodiment of the present disclosure, the first type semiconductor layer 31 and the second type semiconductor layer 33 are both made of gallium nitride.

In addition, the types of the first type semiconductor layer and the second type semiconductor layer are not limited in the embodiments of the present disclosure. In an embodiment of the present disclosure, the first type semiconductor layer is an N type gallium nitride layer, and the second type semiconductor layer is a P-type gallium nitride layer. In other embodiments of the present disclosure, the first type semiconductor layer may be a P-type gallium nitride layer, and the second type semiconductor layer may be an N-type gallium nitride layer.

In this embodiment, the luminous principle of the Micro LED is that holes and electrons are injected from the conductive layer 4 and the graphene layer 2 into the P-type semiconductor layer and the N-type semiconductor layer, respectively, and are combined at the contact surface between the above two semiconductor layers to release energy in a form of photons, and the light-emitting wavelength depends on a forbidden bandwidth of the light-emitting material.

In an embodiment, a gallium nitride crystal is grown on the graphene layer. The gallium nitride crystal can be grown by using a six-membered ring of graphene molecules as a "template", thus the shape of the grown gallium nitride crystal lattice is relatively standardized.

It should be noted that, the material of the conductive layer 4 is not limited herein. Since the conductive layer 4 in the Micro LED is generally used as a current spreading layer, a good electrical conductivity is required. In one embodiment of the present disclosure, in order to avoid shielding the light emitted from the Micro LED and thus caused deterioration of the luminous efficiency of the Micro LED, the conductive layer 4 is made of a transparent conductive material, and may include indium tin oxide (ITO), indium zinc oxide (IZO), zinc oxide (ZnO), indium oxide ($In_2O_3$), indium gallium oxide (IGO), or any combination thereof, which are not limited herein.

The specific structure of the active layer 32 is not limited herein. In an embodiment of the present disclosure, the active layer 32 may be a single layer quantum well (SQW) or a multilayer quantum well (MQW), that is, the structure thereof is a Quantum well that can confine current carriers, but is not limited thereto. The active layer 32 may alternatively be a quantum dot light-emitting layer.

Figure 3:
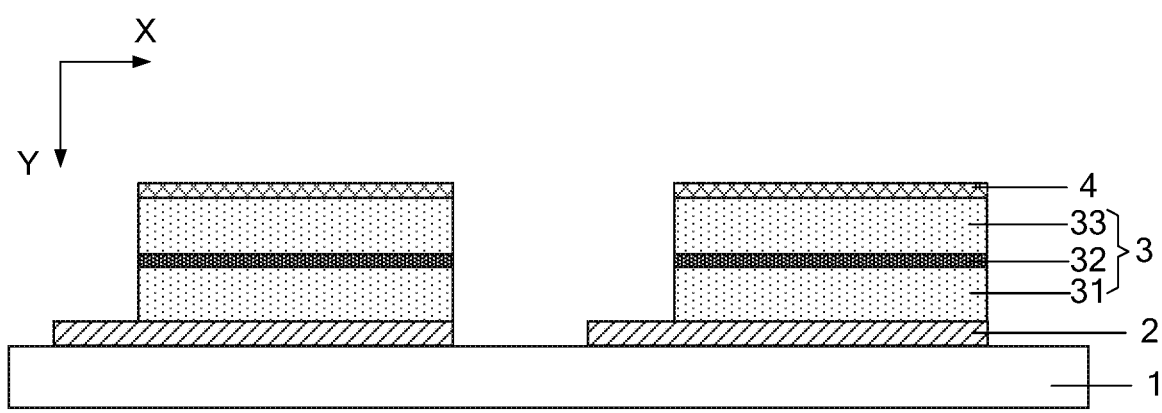

As shown in FIG. 3, the semiconductor layer 3, the conductive layer 4, and the graphene layer 2 are patterned. The semiconductor layer 3 and the conductive layer 4 are firstly patterned so that the patterns of the semiconductor layer 3 and the conductive layer 4 have the same shape and size, which is included but is not limited in this embodiment. It should be noted that, this embodiment is implemented, in a manner that an orthographic projection of the conductive layer 4 on the transfer substrate 1 completely overlaps an orthographic projection of the semiconductor layer 3 on the transfer substrate 1, i.e., the conductive layer is an integral-surface structure. However, this embodiment is not limited herein. In one embodiment, the conductive layer may be patterned to form a block electrode, and may adopt a transparent conductive material or an opaque conductive material, which is not limited in this embodiment.

After the semiconductor layer 3 and the conductive layer 4 are patterned, the graphene layer 2 is then patterned. The patterned graphene layer 2 between the two semiconductor layers 3 adjacent in an X direction is cut by laser cutting, so that the graphene layer 2 has a protruding portion extending beyond the semiconductor layer 3 in the X direction parallel to the transfer substrate 1. However, this embodiment is not limited herein. In one embodiment, the semiconductor layer 3, the conductive layer 4, and the graphene layer 2 may be simultaneously patterned to reduce process steps.

It should be noted that, in this embodiment, the graphene layer 2 has the protruding portion only used for subsequent connection with the thin film transistor, and may has no other protruding portion, facilitating the subsequently formed first protective layer to coat the graphene layer 2. Further, when it is required to form other conductive structure, it is not necessary to provide an insulation layer to insulate the graphene layer, and the other conductive structure can be directly formed outside the first protective layer, thereby saving process steps.

S103: a protective layer is formed on a surface of the Micro LED.

Figure 4:
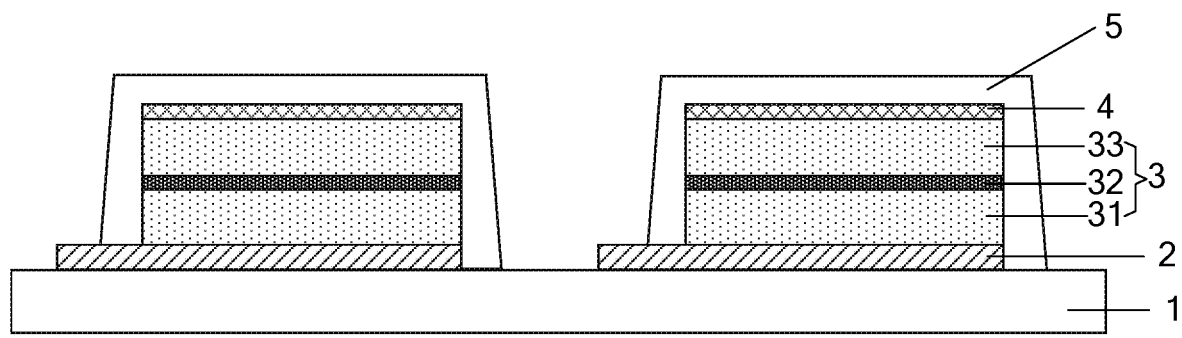

As shown in FIG. 4, a first protective layer 5 is formed on the upper surface of the conductive layer 4, the side surface of the semiconductor layer 3, and the protruding portion of the graphene layer 2. The first protective layer 5 can protect the light-emitting diode during transferring the light-emitting diode.

In this embodiment, the material of the protective layer is not limited. In an embodiment of the present disclosure, the protective layer 5 is made of an insulating material such as silicon oxide.

S104: an array substrate is provided, and the array substrate includes thin film transistor structures.

Figure 5:
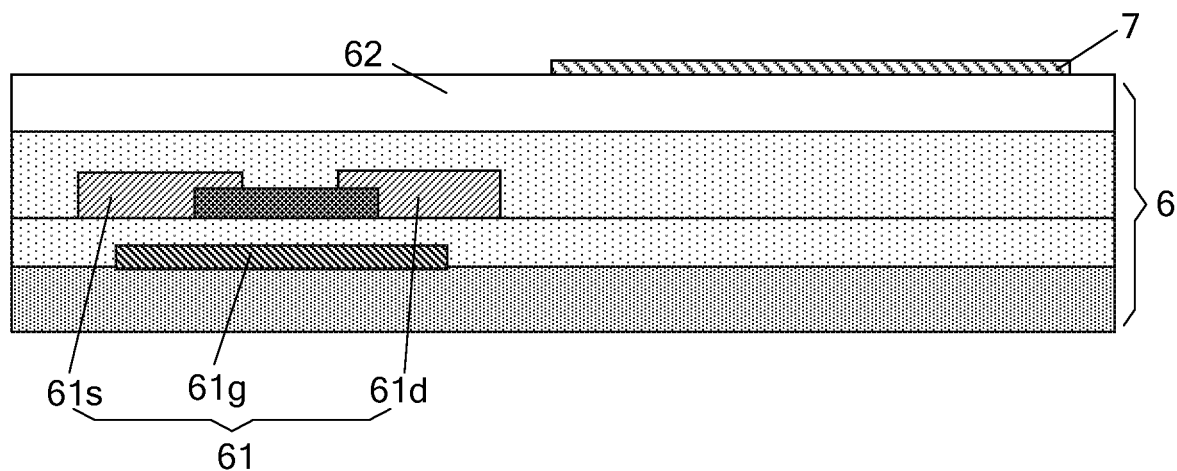

FIG. 5 is schematic structural diagram showing an array substrate according to an embodiment of the present disclosure. Referring to FIG. 5, thin film transistors 61 is formed in the array substrate 6. The thin film transistor 61 includes a drain electrode 61d, a source electrode 61s, an active layer, a gate electrode 61g, and a gate insulation layer. The drain electrode 61d, the source electrode 61s, and the gate electrode 61g may each include molybdenum, titanium, aluminum, copper, etc., or any combination thereof. The gate insulation layer may include silicon nitride, silicon oxide, or a combination thereof. The active layer may include amorphous silicon, polycrystalline silicon, oxide semiconductor, or any combination thereof.

In order to make the surface of the array substrate relatively flat and facilitate the subsequent formation of other structures, in this embodiment, a step of forming a planarization layer 62 on the surface of the array substrate is further included.

The array substrate 6 in this embodiment further includes other structures, such as an underlay substrate, a passivation layer, an insulation layer, etc., which are not elaborated herein.

S105: an organic layer is formed on the array substrate.

Referring to FIG. 5 again, an organic layer 7 is formed on the planarization layer 62 of the array substrate 6. It should be noted that, since the organic layer 7 is used to carry the transferred Micro LED, the organic layer 7 in this embodiment is arranged facing the Micro LED, and may have no overlapping portion with the thin film transistor 61, and the organic layer 7 can be arranged on any portion of the planarization layer 62 as long as it has no influence on formation of the through hole between the Micro LED and the drain electrode of the thin film transistor.

The material of the organic layer 7 is not limited in this embodiment. The organic layer 7 serves as a connection medium between the light-emitting diode and the array substrate 6, that is, the graphene layer is connected to the planarization layer through the organic layer 7, thereby increasing the connection strength between the light-emitting diode and the array substrate and providing excellent mechanical reliability. In an embodiment of the present disclosure, the organic layer 7 may be a self-assembled monomolecular layer structure including at least one type of organic molecules. The selected organic molecules are required to contain an azide functional group and an amino functional group at two ends thereof, respectively, and are not limited to TFPA-NH2. The self-assembled monomolecular layer structure may further includes other molecules including an azide functional group and an amino functional group, and is not limited herein.

In addition, in the embodiment, the organic layer 7 may be alternatively made of other polymer organic material, as long as it can form a good contact with the graphene layer and carry the graphene layer. The polymer organic material may be PEDOT:PSS, in which PEDOT is a polymer of EDOT (i.e., 3,4-ethylenedioxythiophene monomer), and PSS is a polystyrene sulfonate.

In this embodiment, the method for forming the organic layer is not limited. In an embodiment of the present disclosure, the organic layer may be formed by a roll-to-roll process, or may be formed by a coating process.

S106: the Micro LED is transferred from the transfer substrate onto the organic layer, so that the graphene layer is bonded to the organic layer.

Figure 6:
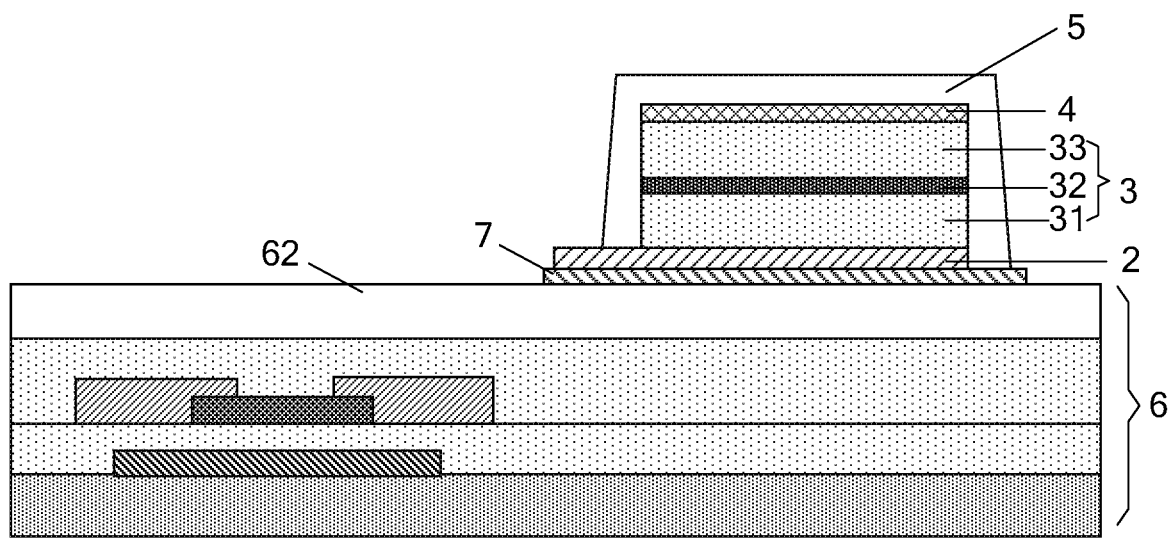

FIG. 6 is a schematic diagram showing a structure formed after the light-emitting dioxide is transferred onto the array substrate. Referring to FIG. 6, after the light-emitting diode is transferred to the organic layer 7, the organic layer 7 is heated so that the azide functional group is connected to the six-membered ring of the graphene molecules in the graphene layer 2 through a chemical bond, thereby transferring the light-emitting diode to the organic layer 7 of the array substrate 6.

It should be noted that, in this embodiment, the method for transferring the Micro LED is not limited. In an embodiment of the present disclosure, a transfer device is used to adsorb a surface of the protective layer 5 facing away from the conductive layer 4, and transfers the Micro LED from the transfer substrate 1 to the organic layer 7 in the region, without the thin film transistor structure, of the array substrate 6. The transfer device may include a transfer head or a transfer base substrate, which are not limited in this embodiment. The Micro LED is picked up by the transfer head, or the Micro LED is adsorbed by the transport base substrate.

It should be noted that, since the Micro LED provided in this embodiment is completely surrounded by the protective layer 5, and the protective layer 5 is not etched to form a through hole before the transfer, the adsorption area is large when the transfer device is used to adsorb the protective layer 5. Compared with the related art in which the protective layer is etched before the adsorption transfer, the adsorption for the protective layer during the transfer is relatively firm in this embodiment.

Since there is no chemical bond connection between the graphene layer 2 and the transfer substrate 1, but the weak van der Waals force is present there between instead, the graphene layer 2 can be separated from the transfer substrate 1 after the protective layer 5 is adsorbed by the transfer device.

In this embodiment, the manner that the transfer device adsorbs the surface of the protective layer facing away from the conductive layer is not limited, and may include adhesion or vacuum adsorption, thereby absorbing the surface of the protective layer facing away from the conductive layer and picking up the Micro LED.

S107: the protective layer on the surface of the Micro LED is etched to form a first through hole exposing the conductive layer, and the array substrate is etched to form a second through hole exposing a drain electrode or a source electrode of the thin film transistor through one etching process.

Figure 7:
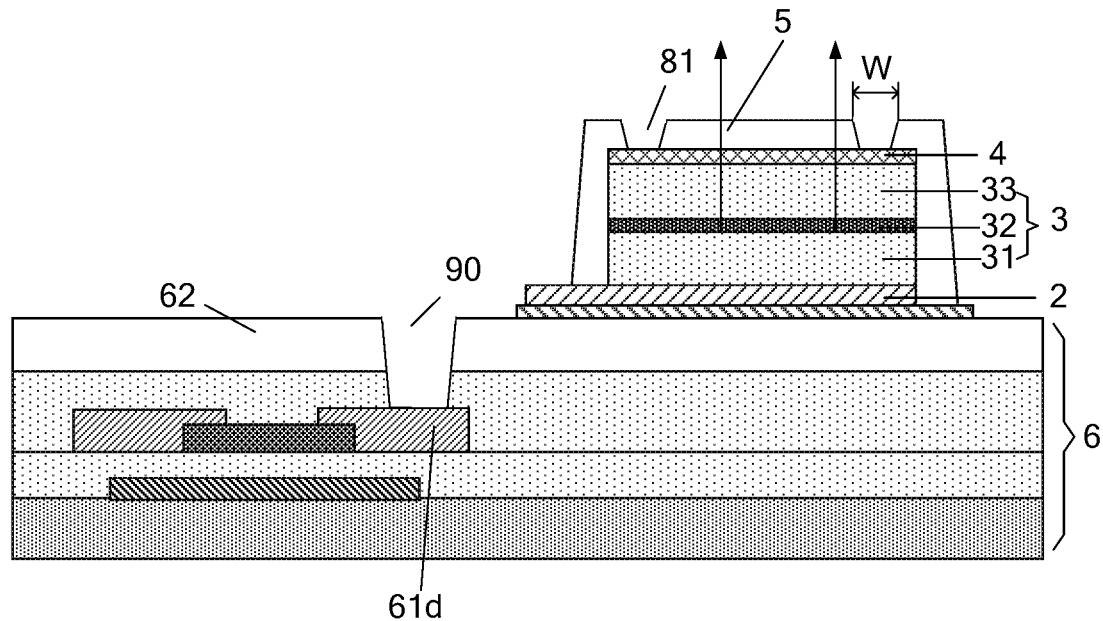

It should be noted that, the structure of the first through hole is not limited in this embodiment. In an embodiment of the present disclosure, as shown in FIG. 7, a projection of the first through hole 81 on the conductive layer has a ring shape in the border region of the Micro LED.

The process of etching the protective layer 5 on the surface of the conductive layer 4 to form the first through hole in this embodiment includes: forming a photoresist pattern on the protective layer 5 located on the surface of the conductive layer 4; photoetching the protective layer 5 located on the surface of the conductive layer to remove a portion of the protective layer located on the surface of the conductive layer; and forming a first through hole 81 having the ring structure, in which the first through hole 81 is distributed in the border region of the Micro LED.

The light-emitting direction of the Micro LED is a direction from the semiconductor layer 3 to the conductive layer 4, as indicated by the upward arrow in FIG. 7, and it is subsequently required that the first through hole 81 be filled with metal to form an electrode of the Micro LED and the metal electrode be located at the light-emitting path of the Micro LID. In order to prevent the metal electrode from shielding the light emitted from the Micro LED, the first through hole 81 is arranged in the border region of the Micro LED in this embodiment. Further, in the case where the use of the electrode is satisfied, the structure of the electrode is set as small as possible. In an embodiment of the present disclosure, the width W of the first through hole 81 is 3 μm or less.

In another embodiment of the present disclosure, in order to make the light emitted from the LED shoot out from a single side and increase the brightness, the area of the first through hole is equal to the area of the conductive layer.

Figure 8:
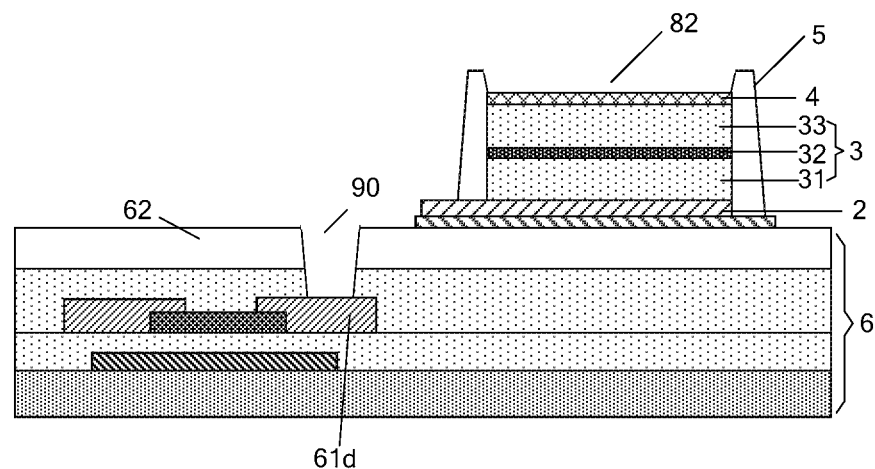

Further, as shown in FIG. 8, the process of etching the protective layer located on the surface of the conductive layer to form the first through hole includes: forming a photoresist pattern on the protective layer 5 located on the surface of the conductive layer 4; photoetching the protective layer 5 located on the surface of the conductive layer 4 to remove the whole protective layer 5 located on the surface of the conductive layer; and forming a first through hole 82 having a same area as the conductive layer 4.

After the first through hole 82 is filled with metal subsequently, the metal reflects the light emitted from the Micro LED, so that all of the light emitted from the Micro LED shoots out from the array substrate side, thereby increasing the brightness of the Micro LED, and satisfying the brightness requirements for the Micro LED display substrate at certain scenarios.

It should be noted that, in this embodiment, the array substrate 6 is etched to form a second through hole 90 exposing the source electrode or the drain electrode 61*d* of the thin film transistor at the same time when the first through hole is formed, regardless of the shape of the first through hole. Whether the source electrode or the drain electrode of the thin film transistor is exposed is not limited in this embodiment. In this embodiment, the drain electrode is connected with one electrode of the Micro LED to supply power.

S108: a conductive metal layer is deposited to fill the first through hole and the second through hole and electrically connect the drain electrode or the source electrode with the graphene layer.

In one embodiment, step S108 includes:

firstly depositing a conductive metal layer covering the array substrate;

etching the whole conductive metal layer so as to remove a portion of the conductive metal layer located on the thin film transistor structure and a portion of the conductive metal layer located at a junction between a portion of the conductive metal layer on the surface of the conductive layer and a portion of the conductive metal layer on the sidewall of the protective layer, to form a first conductive metal layer portion filling the first through hole on the surface of the conductive layer, to form a second conductive metal layer portion filling the second through hole, and to form a third conductive metal layer portion surrounding a side wall of the Micro LED on a surface of the protective layer facing away from the Micro LED;

in which the first conductive metal layer portion is insulated from the third conductive metal layer portion, and the second conductive metal layer portion is electrically connected to the graphene layer.

Figure 9:
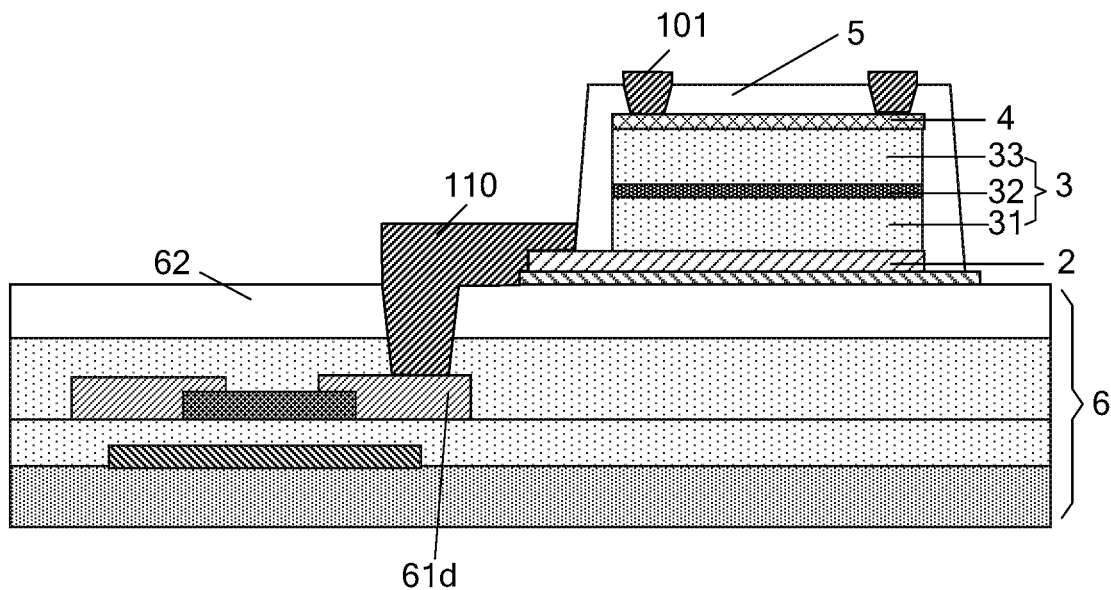

Referring to FIG. 9, when the top view of the first through hole has a ring structure, the first conductive metal layer portion formed in this embodiment is the first conductive metal layer portion 101 located in the first through hole as shown in FIG. 9. The conductive metal layer 101 serves as one electrode of the Micro LED. The second conductive metal layer portion 110 formed in the second through hole electrically connects the graphene layer 2 with the drain electrode 61*d* of the thin film transistor. The graphene layer 2 serves as another electrode of the Micro LED.

Figure 10:
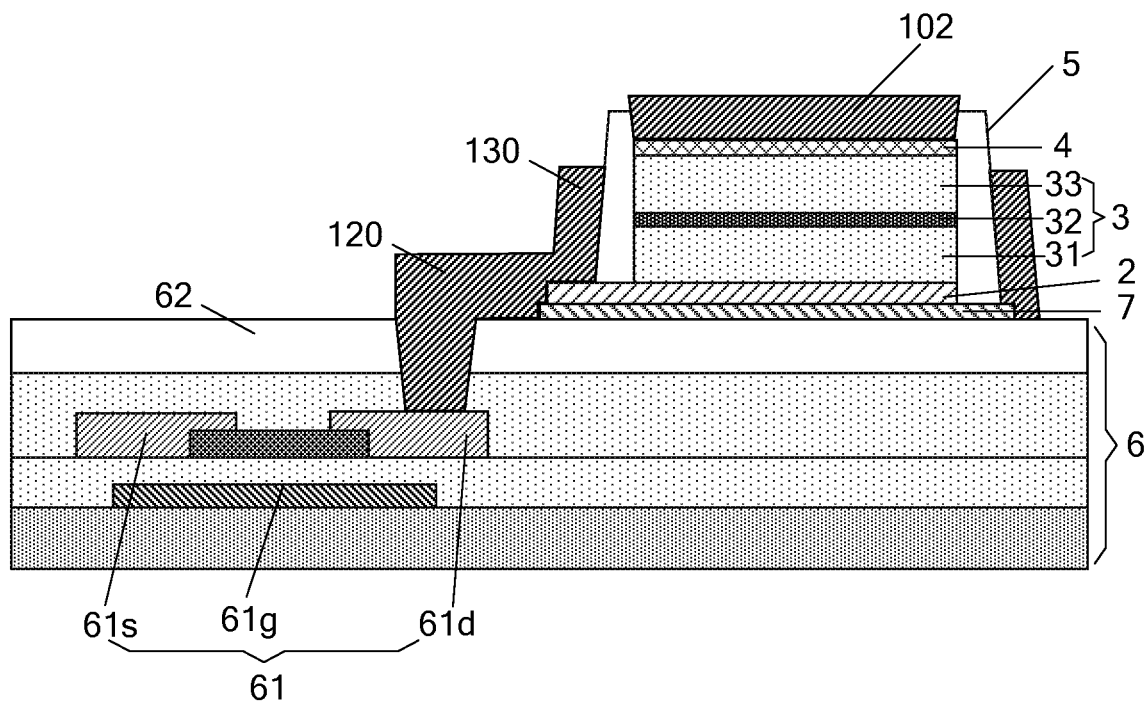

In one embodiment, referring to FIG. 10, the area of the first through hole is equal to the area of the conductive layer, and the first conductive metal layer portion 102 is directly formed in the first through hole as one electrode of the Micro LED. The second conductive metal layer portion 120 formed in the second through hole electrically connects the graphene layer 2 with the drain electrode 61*d* of the thin film transistor, and the graphene layer 2 serves as another electrode of the Micro LED.

When the gate electrode of the thin film transistor controls the thin film transistor to be turned on, the source electrode is connected to an external circuit to supply power to the graphene layer 2, and at the same time the first conductive metal layer portion (101 and 102, or 103) also receives power from the external circuit, so that the two electrodes of the Micro LED are powered, the Micro LED emits light, and the sub-pixel in which the Micro LED is located is illuminated.

It should be noted that, in this embodiment, when the first conductive metal layer portion covers the conductive layer 4, the Micro LED outputs light from a single side. In order to further increase the light-emitting efficiency of the Micro LED and prevent the light from shooting out from a side surface, in this embodiment, a third conductive metal layer portion 130 surrounding the sidewalls of the Micro LED is further formed on the surface of the protective layer 5 facing away from the Micro LED.

In addition, in order to facilitate controlling the light emission of the Micro LED, the first conductive metal layer portions of Micro LEDs may be electrically connected together through an electrical interconnection structure to obtain a common electrode. After applying a voltage to the common electrode, a respective thin film transistor is controlled to apply a voltage to the other electrode of each of the Micro LEDs, so that a specific one of the Micro LEDs can be individually controlled to emit light.

In this embodiment, the electrical interconnection structure may be formed in a same step as the first conductive metal layer portion, and it is only necessary to remain a portion as the electrical interconnection structure during etching and patterning.

Figure 11:
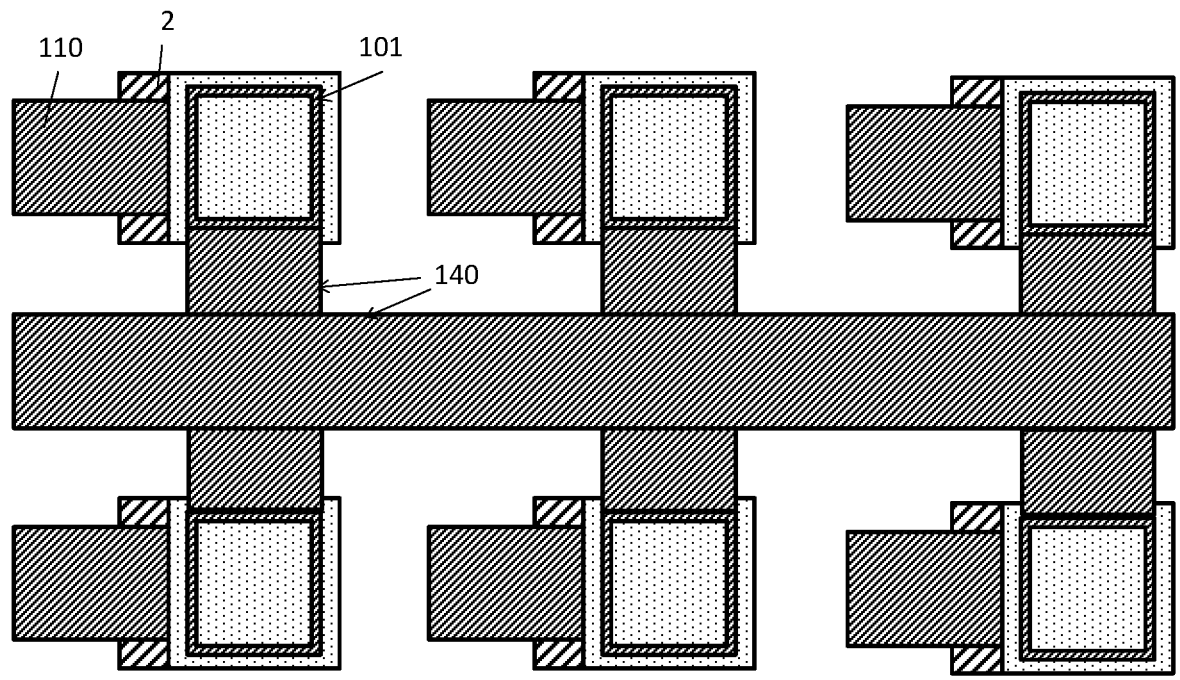
FIG. 11 is a schematic top view of a structure of a Micro LED display substrate according to an embodiment of the present disclosure.

Referring to FIG. 11, FIG. 11 is a schematic top view showing that the first conductive metal layer portions 101, shown in FIG. 9, of the Micro LEDs in the Micro LED display substrate are electrically connected together by an electrical interconnection structure 140. The electrical interconnection structure 140 and the first conductive metal layer portions 101 are formed with a same material in a same step.

Figure 12:
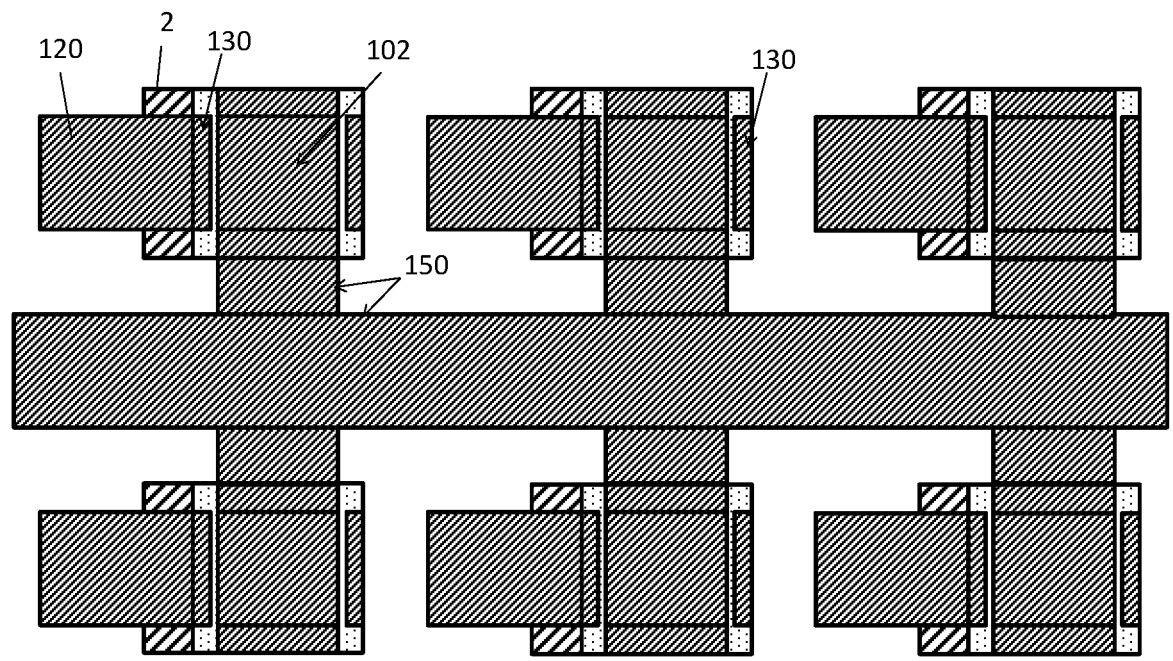
FIG. 12 is a schematic top view of a structure of a Micro LED display substrate according to another embodiment of the present disclosure.

Similarly, referring to FIG. 12, FIG. 12 is a schematic top view showing that the first conductive metal layer portions 102, shown in FIG. 10, of Micro LEDs in the Micro LED display substrate are electrically connected together by an electrical interconnection structure 150. The electrical interconnection structure 150 and the first conductive metal layer portions 102 are formed with a same material in a same step.

In the method for manufacturing the Micro LED display substrate provided by the embodiments of the present disclosure, firstly the graphene layer is formed on the transfer substrate, then the Micro LED structure is formed on the graphene layer, then the protective layer is formed on the surface of the Micro LED, the Micro LED is transferred to the organic layer of the array substrate by adsorption of the protection layer, and the transfer of the Micro LED is finished through bonding between the graphene layer and the organic layer. Then, through one etching step, through holes are formed in the protective layer and the array substrate to expose the conductive layer of the Micro LED and the source electrode or the drain electrode of the thin film transistor on the array substrate, and then through one metal deposition step, the electrode of the Micro LED and the structure electrically connecting the graphene layer with the source electrode or drain electrode of the thin film transistor are formed. Compared with the related art in which the electrode of the Micro LED and the structure electrically connecting the graphene layer with the source electrode or the drain electrode of the thin film transistor are separately formed through two etching steps and two metal deposition steps, the method for manufacturing the Micro LED provided by the present disclosure saves process steps, making the method for manufacturing the Micro LED simpler and avoiding waste generated from two etchings and two metal depositions, thereby reducing process costs.

Another embodiment of the present disclosure further provides a Micro LED display substrate formed by the method for manufacturing the Micro LED display substrate as described in the above embodiments. Referring to FIG. 10, the Micro LED display substrate includes: an array substrate 6 comprising thin film transistor structures 61 arranged in an array; an organic layer 7 located on a surface of the array substrate 6; a graphene layer 2 located on a surface of the organic layer 7 facing away from the array substrate 6; a Micro LED (3, 4) located on a surface of the graphene layer 2 facing away from the array substrate 6; a protective layer 5 located on a surface of the Micro LED (3, 4); and a conductive metal layer which includes a conductive metal layer 102 penetrating through the protective layer 5 and electrically connected to the conductive layer 4 of the Micro LED, and a conductive metal layer 120 electrically connected to the graphene layer 2 and a drain electrode 61d or a source electrode 61s of the thin film transistor structure.

In this embodiment, the Micro LED outputs light from a single side, and the area of the conductive metal layer 102 is equal to the area of the conductive layer 4 of the Micro LED. In order to obtain a high light output efficiency of the Micro LED when the light shoots out from a single side, the conductive metal layer may further include a third conductive metal layer portion 130 surrounding the protective layer at the side wall of the Micro LED.

The conductive metal layer provided in this embodiment includes: a first conductive metal layer portion 102 electrically connected to the conductive layer 4 of the Micro LED; a second conductive metal layer portion 120 electrically connecting the graphene layer 2 and the drain electrode 61d or the source electrode of the thin film transistor structure; and a third conductive metal layer portion 130 surrounding the side wall of the Micro LED. The first conductive metal layer portion 102 is insulated from the third conductive metal layer portion 130.

The structure of the Micro LED display substrate provided by the embodiments of the present disclosure may be alternatively the structure as shown in FIG. 9. Unlike the Micro LED display substrate structure shown in FIG. 10, the first conductive metal layer portion 101 in FIG. 9 has a ring shape surrounding the border region of the Micro LED, avoiding large shielding to the light emitted from the Micro LED. In order to increase the light output efficiency, a third conductive metal layer portion may be arranged outside the sidewall protective layer of the Micro LED.

The shape of the first conductive metal layer portion 101 shown in FIG. 9 is not limited, and its projection on the array substrate may have a rectangular ring shape, as shown in FIG. 11, or a circular ring shape.

It should be noted that, in a process of actual use, in order to facilitate controlling the light emission of the Micro LED, the first conductive metal layer portions of Micro LEDs may be electrically connected together through an electrical interconnection structure to obtain a common electrode. After a voltage is applied to the common electrode, a respective thin film transistor is controlled to apply a voltage to the other electrode of each of the Micro LEDs, so that a specific one of the Micro LEDs can be individually controlled to emit light.

The Micro LED display substrate may further include an electrical interconnection structure. The electrical interconnection structure electrically connects the conductive metal layers in Micro LEDs, each conductive metal layer penetrating through the protective layer and electrically connected to the conductive layer of a respective Micro LED. The electrical interconnection structure and the conductive metal layer are formed in a same process step. The electrical interconnection structure can the conductive metal layer 140 as shown in FIG. 11 or the conductive metal layer 150 as shown in FIG. 12.

Since the Micro LED display substrate provided by the embodiments of the present disclosure is formed by the method for manufacturing the Micro LED display substrate described in the above embodiments, the formed common electrode (101 or 102) of the Micro LED is made of a same conductive metal material as the conductive metal material electrically connecting the graphene layer 2 and the source electrode or the drain electrode 61d of the thin film transistor structure 61. Since the conductive metal material has a small resistance and a large conductivity, better electrical transmission can be realized; further, because the two metal layers are formed by the same material, the process steps are reduced, and the amount of the used materials is reduced, thereby reducing the manufacturing cost of the Micro LED display substrate.

Figure 13:
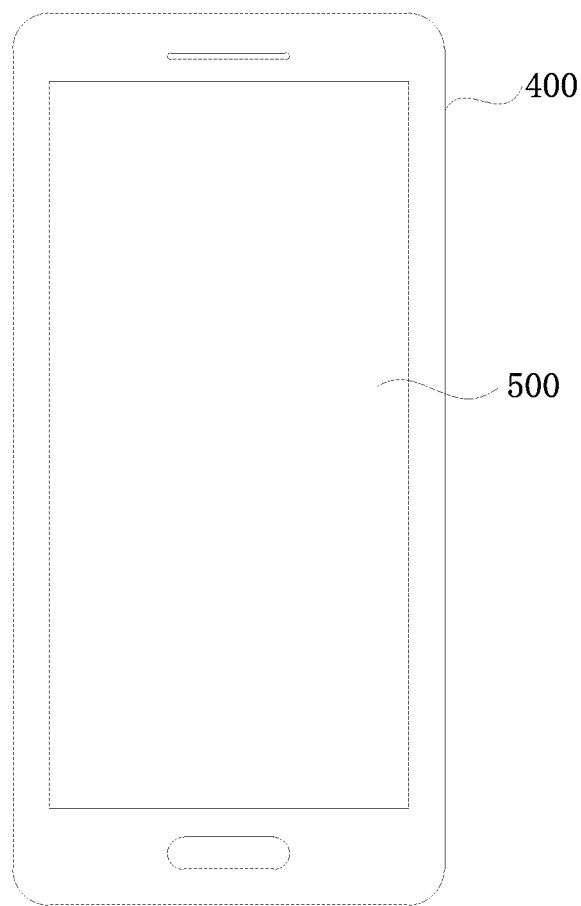
FIG. 13 is a schematic diagram showing a Micro LED display device according to an embodiment of the present disclosure.

The present disclosure also provides a Micro LED display device. FIG. 13 is a schematic diagram showing a Micro LED display device according to an embodiment of the present disclosure. Referring to FIG. 13, the display device 400 includes a display panel 500 including the Micro LED display substrate as described in any embodiment of the present disclosure. The display device 400 may be a mobile phone as shown in FIG. 13, or a computer, a television, a smart wearable display device, etc., which is not limited herein.

Since the Micro LED display device provided by the present disclosure includes the Micro LED display substrate of the above embodiments, the manufacturing cost thereof can also be reduced.

It should be noted that the various embodiments in the present specification are described in a progressive manner, each embodiment focuses on differences from other embodiments, and the same and similar parts between the various embodiments can be referred to each other.

What is claimed is:

1. A method for manufacturing a micro light-emitting diode display substrate, comprising:
    forming a graphene layer on a transfer substrate;
    forming a semiconductor layer on a surface of the graphene layer facing away from the transfer substrate, and forming a conductive layer on a surface of the semiconductor layer facing away from the transfer substrate, the semiconductor layer and the conductive layer forming a micro light-emitting diode;
    forming a protective layer on a surface of the micro light-emitting diode, wherein the protective layer covers a surface of the conductive layer facing away from the semiconductor layer and two opposite side surfaces of the semiconductor layer;
    providing an array substrate comprising a plurality of thin film transistor structures;
    forming an organic layer on the array substrate;
    transferring the micro light-emitting diode covered by the protective layer from the transfer substrate onto the organic layer so that the graphene layer is bonded to the organic layer;
    after said transferring, simultaneously etching the protective layer on the surface of the micro light-emitting diode to form a first through hole exposing the conductive layer, and the array substrate to form a second through hole exposing a drain electrode or a source electrode of the plurality of thin film transistor structures; and
    depositing a conductive metal layer, filling the first through hole and the second through hole and electrically connecting the drain electrode or the source electrode with the graphene layer,
    wherein said depositing a conductive metal layer filling the first through hole and the second through hole and electrically connecting the drain electrode or the source electrode with the graphene layer comprises:

depositing a conductive metal layer covering the array substrate;

etching the conductive metal layer so as to remove a portion of the conductive metal layer located on the plurality of thin film transistor structures and remove a portion of the conductive metal layer located at a junction between a portion of the conductive metal layer located on the surface of the conductive layer and a portion of the conductive metal layer located on the sidewall of the protective layer, to form a first conductive metal layer filling the first through hole on the surface of the conductive layer, form a second conductive metal layer filling the second through hole, and form a third conductive metal layer surrounding a side wall of the micro light-emitting diode on a surface of the protective layer facing away from the micro light-emitting diode;

wherein the first conductive metal layer is insulated from the third conductive metal layer, and the second conductive metal layer is electrically connected to the graphene layer.

2. The method for manufacturing the micro light-emitting diode display substrate according to claim 1, wherein a projection of the first through hole on the conductive layer has an ring shape in a border region of the micro light-emitting diode;

said etching the protective layer on a surface of the conductive layer to form a first through hole comprises:

forming a photoresist pattern on the protective layer located on the surface of the conductive layer;

photoetching the protective layer located on the surface of the conductive layer so as to remove a portion of the protective layer located on the surface of the conductive layer to form the first through hole whose projection on the conductive layer has the ring shape, the first through hole being distributed in the border region of the micro light-emitting diode.

3. The method for manufacturing the micro light-emitting diode display substrate according to claim 1, wherein the first through hole has an area equal to an area of the conductive layer;

said etching the protective layer on a surface of the conductive layer to form a first through hole comprises:

forming a photoresist pattern on the protective layer located on the surface of the conductive layer;

photoetching the protective layer located on the surface of the conductive layer so as to remove all of the protective layer located on the surface of the conductive layer to form the first through hole having the area equal to the area of the conductive layer.

4. The method for manufacturing the micro light-emitting diode display substrate according to claim 1, prior to forming the organic layer on the array substrate, further comprising:

forming a planarization layer on the array substrate.

5. The method for manufacturing the micro light-emitting diode display substrate according to claim 1, wherein said transferring the micro light-emitting diode from the transfer substrate onto the organic layer comprises:

adsorbing, by a transfer device, a surface of the protective layer facing away from the conductive layer so as to transfer the micro light-emitting diode from the transfer substrate onto a portion of the organic layer located on a region of the array substrate without the plurality of thin film transistor structures.

6. The method for manufacturing the micro light-emitting diode display substrate according to claim 1, wherein said adsorbing, by a transfer device, a surface of the protective layer facing away from the conductive layer comprises:

adsorbing the surface of the protective layer facing away from the conductive layer by means of adhesion; or adsorbing the surface of the protective layer facing away from the conductive layer by means of vacuum adsorption.

7. The method for manufacturing the micro light-emitting diode display substrate according to claim 1, wherein said forming a semiconductor layer on a surface of the graphene layer facing away from the transfer substrate, and forming a conductive layer on a surface of the semiconductor layer facing away from the transfer substrate, the semiconductor layer and the conductive layer forming a micro light-emitting diode comprises:

forming a first type semiconductor layer on the surface of the graphene layer facing away from the transfer substrate;

forming an active layer on a surface of the first type semiconductor layer facing away from the graphene layer;

forming a second type semiconductor layer on a surface of the active layer facing away from the first type semiconductor layer; and forming the conductive layer on a surface of the second type semiconductor layer facing away from the active layer.

8. The method for manufacturing the micro light-emitting diode display substrate according to claim 1, wherein the first type semiconductor layer is an N-type semiconductor layer, and the second type semiconductor layer is a P-type semiconductor layer.

* * * * *